US006753246B2

(12) United States Patent
Kawashima et al.

(10) Patent No.: US 6,753,246 B2
(45) Date of Patent: Jun. 22, 2004

(54) SEMICONDUCTOR DEVICE WITH A FIRST DUMMY PATTERN

(75) Inventors: Hiroshi Kawashima, Hyogo (JP); Masakazu Okada, Hyogo (JP); Takeshi Kitani, Hyogo (JP); Motoshige Igarashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/419,770

(22) Filed: Apr. 22, 2003

(65) Prior Publication Data

US 2003/0178647 A1 Sep. 25, 2003

Related U.S. Application Data

(60) Division of application No. 09/828,981, filed on Apr. 10, 2001, now Pat. No. 6,563,148, which is a continuation-in-part of application No. 09/660,398, filed on Sep. 12, 2000, now abandoned.

(30) Foreign Application Priority Data

Apr. 19, 2000 (JP) ........................................ 2000-117629
Jan. 22, 2001 (JP) ........................................ 2001-012789

(51) Int. Cl.[7] ........................................ H01L 21/4763
(52) U.S. Cl. ........................ 438/618; 438/693; 438/700; 438/701
(58) Field of Search .............................. 438/693, 700, 438/701

(56) References Cited

U.S. PATENT DOCUMENTS

| 5,790,417 | A | 8/1998 | Chao et al. |
| 6,099,992 | A | 8/2000 | Motoyama et al. |
| 6,153,918 | A | 11/2000 | Kawashima et al. |
| 6,291,870 | B1 | 9/2001 | Kawashima et al. |
| 6,326,309 | B2 * | 12/2001 | Hatanaka et al. ............ 438/693 |

FOREIGN PATENT DOCUMENTS

| JP | 8-213396 | 8/1996 |
| JP | 9-181159 | 7/1997 |
| JP | 9-306996 | 11/1997 |
| JP | 11-297841 | 10/1999 |

* cited by examiner

*Primary Examiner*—David Nelms
*Assistant Examiner*—Mai-Huong Tran
(74) *Attorney, Agent, or Firm*—McDermott, Will & Emery (57) ABSTRACT

The semiconductor device includes a semiconductor substrate and, in an element isolating region in the semiconductor substrate, a first active area A/A dummy pattern and a second A/A dummy pattern having a pitch smaller than that of the first A/A dummy pattern. Placement of the first A/A dummy pattern and placement of the second A/A dummy pattern are carried out in separate steps. The semiconductor substrate may be divided into a plurality of mesh regions, and a dummy pattern may be placed in each mesh region according to an area of the mesh region being occupied by an element pattern located therein.

12 Claims, 11 Drawing Sheets

SEMICONDUCTOR DEVICE WITH A FIRST DUMMY PATTERN

This application is a divisional of application Ser. No. 09/828,981 filed Apr. 10, 2001, now U.S. Pat. No. 6,563,148 which is a continuation-in-part of U.S. patent application Ser. No. 09/660,398 filed Sep. 12, 2000 now abandoned.

BACKGROUND OF THE INVENTION

1. Field of the Invention

The present invention relates to a semiconductor device provided with a dummy pattern for alleviating irregularity of the surface due to an uneven density of a pattern being manufactured, and a method of placing such a dummy pattern.

2. Description of the Background Art

Conventionally, a semiconductor device has been known in which a dummy pattern is placed in an element isolating region so as to alleviate a problem of uneven or irregular surface of a separative insulating film, that is created in the element isolating region in chemical mechanical polishing (CMP) process due to sparseness of an originally designed element forming region pattern.

An example of dummy pattern being formed in an interconnection layer is disclosed in Japanese Patent Laying-Open No. 8-213396. An example of dummy pattern being formed with shallow trench isolation (STI) to separate element forming region patterns is disclosed in Japanese Patent Laying-Open No. 9-181159.

In recent semiconductor devices, STI has been utilized to separate all the elements therein, for simplification of manufacturing process. Thus, the element isolating region 103 as shown in FIG. 18 has become extremely large.

Figure 18:
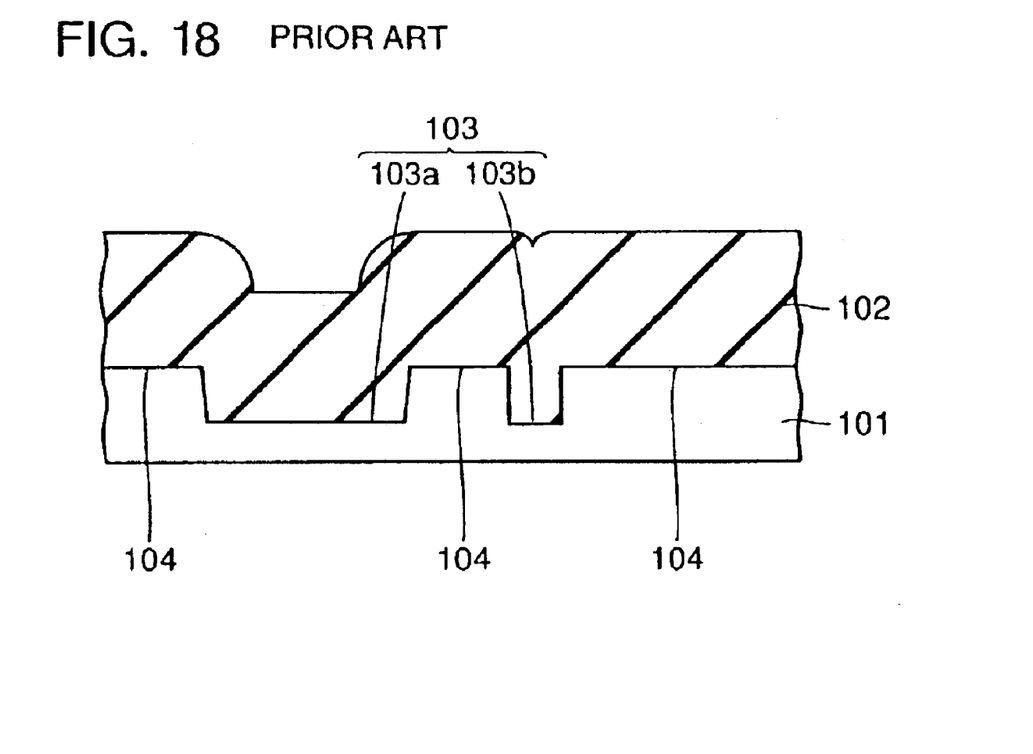
FIG. 18 is a cross sectional view of a conventional semiconductor device having no dummy patterns, in which an insulating film for formation of a separative insulating film is deposited.

Referring to FIG. 18, trenches 103a, 103b are formed in element isolating region 103 of a semiconductor substrate 101, and an insulating film 102 is deposited to cover trenches 103a, 103b. Thereafter, CMP, etchback or the like is performed for planarization.

Figure 19:
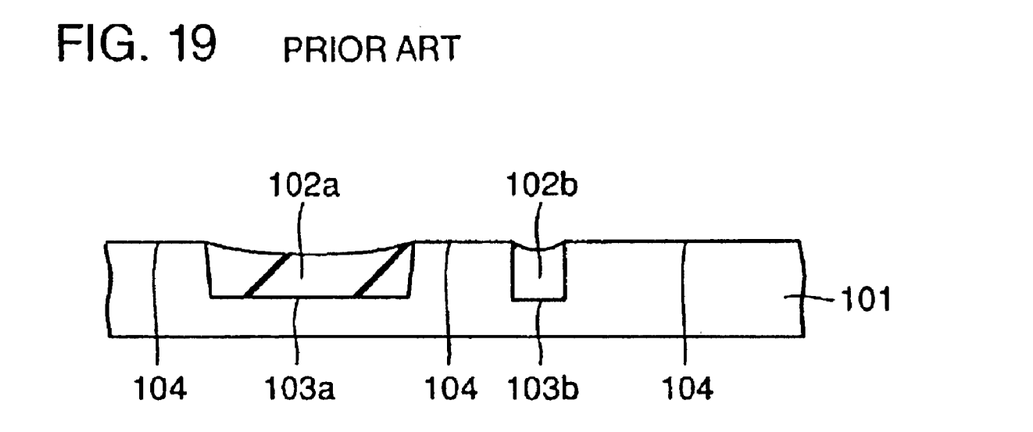
FIG. 19 is a cross sectional view of the conventional semiconductor device having no dummy patterns, in which the separative insulating film is formed by CMP.

At this time, as shown in FIG. 19, a relatively large valley or depression is created on the surface of a separative insulating film 102a formed in the wide trench 103a as compared to the case of a separative insulating film 102b formed in the narrow trench 103b.

Figure 20:
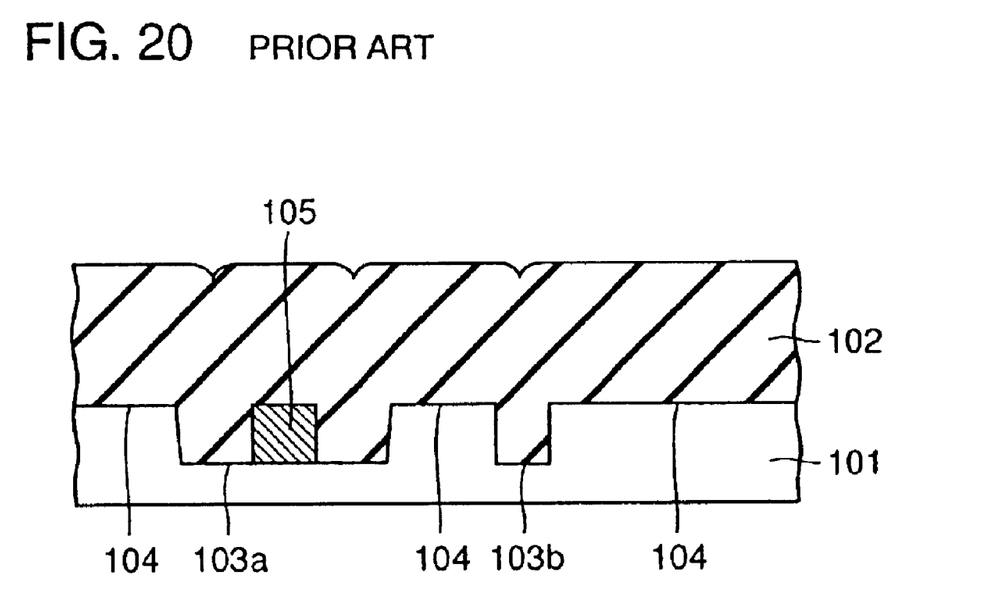
FIG. 20 is a cross sectional view of a conventional semiconductor device having dummy patterns, in which an insulating film for formation of a separative insulating film is deposited.

A technique to prevent creation of such a large depression is to form, as shown in FIG. 20, a dummy pattern 105 in the wide trench 103a before deposition of insulating film 102, CMP or the like.

Figure 21:
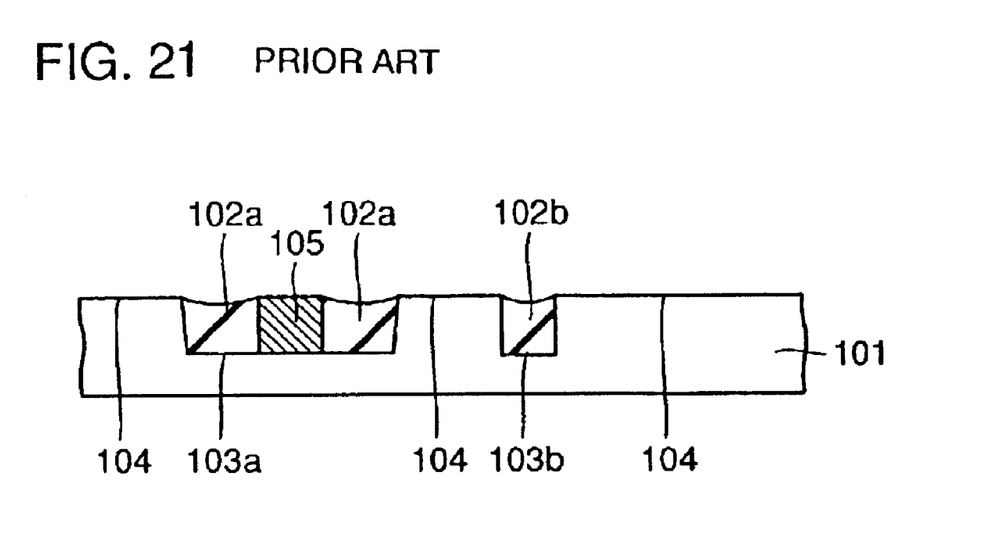
FIG. 21 is a cross sectional view of the conventional semiconductor device having dummy patterns, in which the separative insulating film is formed by CMP.

According to this technique, as shown in FIG. 21, the depression of the surface of separative insulating film 102a left within the wide trench 103a after CMP or the like becomes less obvious. Thus, compared to the case where CMP or the like was performed without provision of dummy pattern 105 as in FIG. 15, it is possible to improve evenness or flatness of the surface of separative insulating film 102a formed within the wide trench 103a. Consequently, greater planarization of the semiconductor device is achieved.

To further improve planarization or dimension control of the semiconductor device, it is effective to reduce a pitch (width) of dummy pattern 105. This enables dummy patterns 105 to be placed thoroughly over the entire semiconductor device, so that the planarization of the semiconductor device as well as the dimension control will further improve.

The conventional dummy patterns 105, however, were placed automatically by calculation automatic design (CAD) process, and they had a fixed pitch. It was difficult to place such dummy patterns 105 with a fixed, small pitch thoroughly over the entire semiconductor device, because not only the CAD processing time but also the CAD processing capacity required would increase, and the processing itself might become impossible.

Placing the dummy patterns 105 uniformly over the entire semiconductor device poses another problem that dummy pattern 105 would be placed even in a region where the pattern density is originally large. In such a case, sufficient improvement in planarization cannot be expected.

SUMMARY OF THE INVENTION

The present invention is directed to solve the above-described problem. An object of the present invention is to improve the planarization of a semiconductor device, and, at the same time, to reduce the CAD processing time and capacity required for placement of dummy patterns.

The semiconductor device according to a first aspect of the present invention includes: an element pattern formed on a semiconductor substrate; a first dummy pattern placed in the same layer as the element pattern; and a second dummy pattern placed in the same layer as the element pattern and having a pitch different from that of the first dummy pattern. Herein, patterns in the "same layer" refer to layers or portions that exist in or on the semiconductor substrate approximately at the same height, like, e.g., neighboring dummy patterns 5a and 5b shown in FIG. 13. The "element pattern" refers to a pattern constituting an element, which is a concept including an active area pattern, an interconnection pattern and the like, as will be described later in detail.

By providing the first and second dummy patterns having different pitches from each other, it is possible, e.g., to place the first dummy pattern having a relatively large pitch in a wide region of an element isolating region, and to place the second dummy pattern having a relatively small pitch in a relatively small region. Thus, the dummy patterns can be placed thoroughly over the entire semiconductor device In addition, by placing the first and second dummy patterns according to pitch size, in descending order, for example, it is possible to substantially reduce a processing region for placement of the dummy pattern having the smaller pitch. As a result, compared to the case where dummy patterns with a fixed, small pitch are placed all over the regions, both the CAD processing time and the CAD processing capacity required can be reduced.

The element pattern may include an element forming region pattern (active area pattern) formed in the semiconductor substrate and isolated by an element isolating region. In this case, the first and second dummy patterns are placed in the element isolating region.

The element pattern may include an interconnection pattern formed on the semiconductor substrate. In this case, the first and second dummy patterns are placed around the interconnection pattern.

In either case, it is possible to place the dummy patterns thoroughly over the entire semiconductor device.

The semiconductor device according to a second aspect of the present invention includes: a plurality of mesh regions (divided regions) on a semiconductor substrate; an element pattern located within the mesh region; and a dummy pattern placed within the mesh region to occupy a certain ratio of an area therein determined according to an occupy ratio of the element pattern that is defined as a ratio of an area of the element pattern in the mesh region with respect to a total area of the mesh region.

Thus, by dividing the region on the semiconductor substrate into a plurality of mesh regions, and by placing the dummy pattern in each mesh region according to the occupy ratio of the element pattern therein, it becomes possible to appropriately place the dummy pattern in each mesh region according to the density of the element pattern therein. Thus, the dummy pattern can be placed thoroughly over the entire semiconductor device, and variation in degrees of irregularity among the mesh regions can be reduced. As a result, it is possible to improve the planarization of the semiconductor device. Further, by placing the dummy pattern of an appropriate size according to the density of the element pattern, the CAD processing time as well as the CAD processing capacity required can be reduced.

Preferably, the dummy pattern includes first and second dummy patterns having pitches different from each other. This helps further improve the planarization of the semiconductor device.

In either aspect, placement of the first dummy pattern and placement of the second dummy pattern are preferably carried out in different steps. In addition, if the semiconductor device has a first region in which the first dummy pattern is to be placed and a second region in which the second dummy pattern is to be placed, placement of the first dummy pattern in the first region and placement of the second dummy pattern in the second region are preferably carried out in separate steps. Further, it is preferable that the dummy patterns are placed according to pitch size, in descending order.

Thus, by placing the dummy patterns having different pitches in different steps, it is possible to reduce the CAD processing time and capacity.

The dummy pattern placing method according to the first aspect of the present invention is employed in a semiconductor device provided with a first dummy pattern with a relatively large pitch and a second dummy pattern with a relatively small pitch placed in the same layer. In this method, placement of the first dummy pattern and placement of the second dummy pattern are carried out in different steps.

This reduces the CAD processing time as well as the CAD processing capacity required, as described above.

The first and second dummy patterns may be placed in an element isolating region of the semiconductor device that is divided into a first region in which the first dummy pattern is to be placed and a second region in which the second dummy pattern is to be placed. In this case, the second dummy pattern is preferably placed in the second region after the first dummy pattern is placed in the first region.

Alternatively, the first and second dummy patterns may be placed around an interconnection pattern of the semiconductor device. The region between the interconnection patterns is divided into a first region in which the first dummy pattern is to be placed and a second region in which the second dummy pattern is to be placed. In this case, the second dummy pattern is preferably placed in the second region after the first dummy pattern is placed in the first region.

Thus, by distinguishing the regions for forming the first and second dummy patterns therein, it is possible to process the second region only at the time of placement of the second dummy pattern. Thus, the region for CAD processing is reduced, which can further reduce the CAD processing time and capacity.

The first dummy pattern may include a first upper dummy pattern and a first lower dummy pattern. The second dummy pattern may include a second upper dummy pattern and a second lower dummy pattern. In this case, data for placement of the first and second lower dummy patterns can be appropriated to data for placement of the first and second upper dummy patterns.

Such utilization of the data for placement of the lower dummy patterns as the data for placement of the upper dummy patterns can contribute to a further reduction in time and capacity of the CAD processing.

The dummy pattern placing method according to the second aspect of the present invention includes the following steps. A semiconductor chip region is divided into a plurality of mesh regions. A second occupy ratio that is defined as a ratio of an area of a dummy pattern to be placed in the mesh region with respect to a total area of the mesh region is determined based on a first occupy ratio that is defined as a ratio of an area of an element pattern located in the mesh region with respect to the total area of the mesh region. The dummy pattern is then placed within the mesh region to occupy an area satisfying the second occupy ratio.

Thus, by placing the dummy pattern within each mesh region based on the occupy ratio of the element pattern therein, it is possible to reduce variation in degrees of irregularity among the mesh regions. Thus, the planarization of the semiconductor device can be improved. In addition, by placing the dummy pattern of an appropriate size based on the first occupy ratio, it is possible to reduce both the CAD processing time and capacity.

The step of placing the dummy pattern includes the step of adjusting a size of the dummy pattern such that the dummy pattern occupies an area within the mesh region corresponding to the second occupy ratio. Thus, the size of the dummy pattern can be optimized, so that the CAD processing time and capacity required can be reduced.

The step of determining the second occupy ratio may include the step of, after determining the first occupy ratios in the respective mesh regions, performing Fourier transform to calculate occupy ratio distribution of the first occupy ratios over the entire semiconductor chip region. In this case, the step of placing the dummy pattern includes the step of placing the dummy pattern according to the occupy ratio distribution obtained.

Alternatively, the step of determining the second occupy ratio may include the step of, after determining the first occupy ratios in the respective mesh regions, calculating an average occupy ratio of the first occupy ratios of a plurality of mesh regions. In this case, the step of placing the dummy pattern includes the step of placing the dummy pattern according to the average occupy ratio obtained.

Thus, by calculating the second occupy ratio as described above, the dummy pattern can be selected and placed more efficiently.

It is preferable that the second occupy ratio is set smaller as the first occupy ratio is larger. Thus, it becomes possible to reduce variation in degrees of irregularity among the mesh regions.

The step of determining the second occupy ratio preferably includes the step of combining the first occupy ratio with an occupy ratio of element pattern in a corresponding lower layer to calculate the second occupy ratio. Herein, the "combining" means to determine the second occupy ratio by taking into consideration the first occupy ratio as well as the occupy ratio of element pattern in the lower layer. This includes not only the case where the occupy ratio of element pattern in the lower layer is simply added to the first occupy ratio, but also the case where the first occupy ratio is multiplied by a prescribed coefficient obtained from the occupy ratio of element pattern in the lower layer.

Thus, by determining the second occupy ratio even taking the irregularity in the lower layer into consideration, it becomes possible to alleviate the unevenness in the semiconductor device even if regions having dense patterns are stacked one on the other or regions having sparse patterns are stacked one on the other.

In either aspect, the first dummy pattern may be placed in a first cell region and the second dummy pattern may be placed in a second cell region, and the pitch of the first cell region may be made larger than the pitch of the second cell region. In this case, a ratio of an area of the second cell region being occupied by the second dummy pattern is made greater than a ratio of an area of the first cell region being occupied by the first dummy pattern.

Accordingly, it is possible to place the second dummy pattern in a small region where the first dummy pattern cannot be placed. This further reduces the variation in degrees of irregularity among the mesh regions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to FIGS. 1 to 17.

First Embodiment

Referring first to FIGS. 1 to 11, a design flow of a semiconductor device according to the first embodiment will be described.

Figure 1:
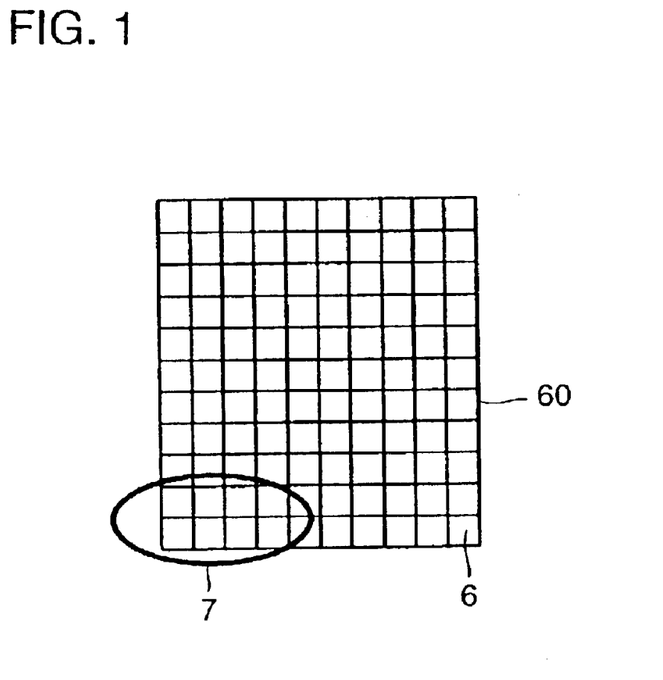
FIG. 1 illustrates cell regions including dummy patterns therein being systematically placed on an orthogonal grid, in a semiconductor device according to a first embodiment of the present invention.
Figure 2:
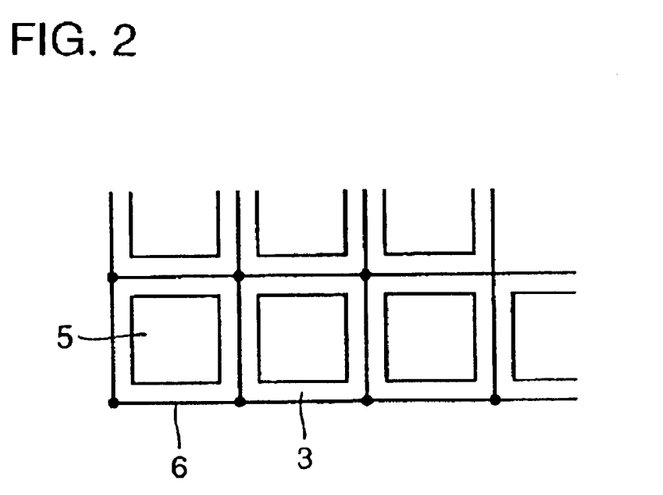
FIG. 2 is an enlarged view of a region 7 in FIG. 1.
Figure 3:
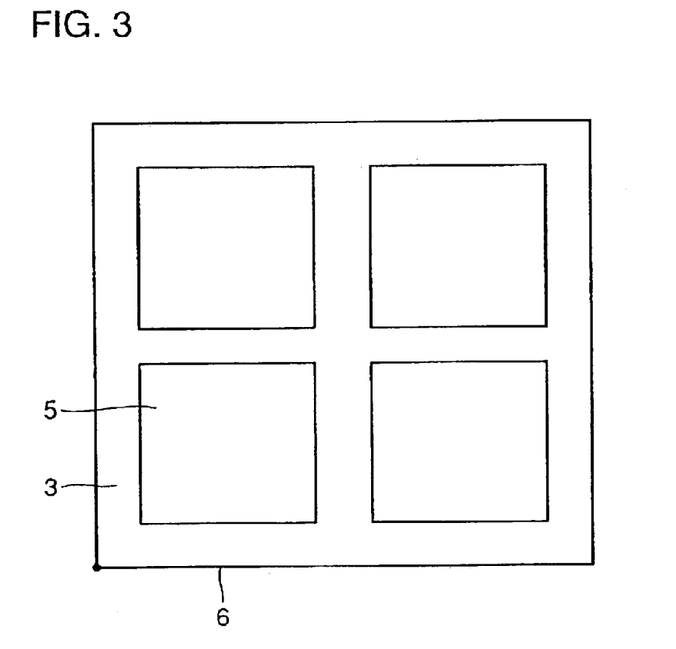
FIGS. 3–6 show examples in each of which rectangular dummy patterns are placed in a cell region in different configurations.
Figure 4:
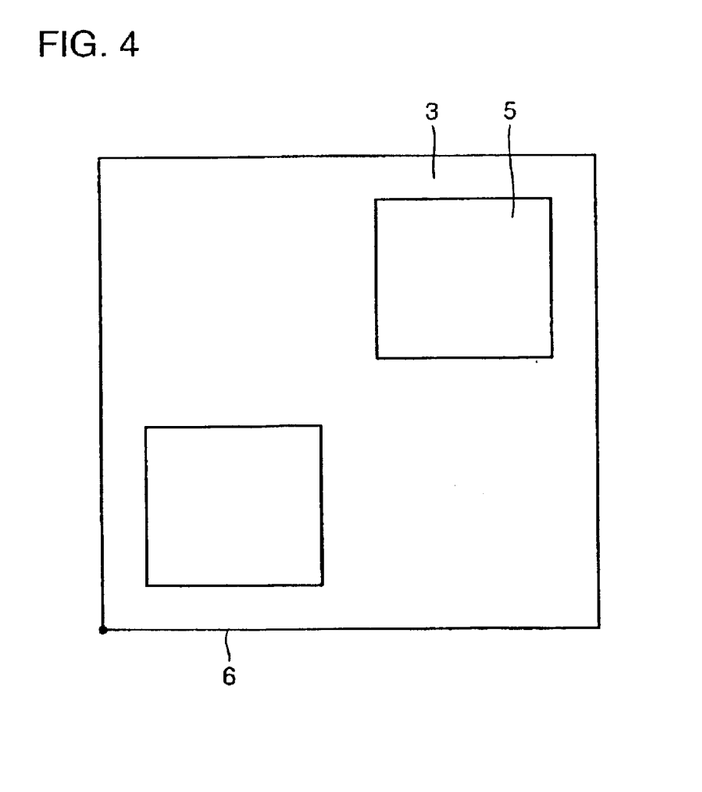
Figure 5:
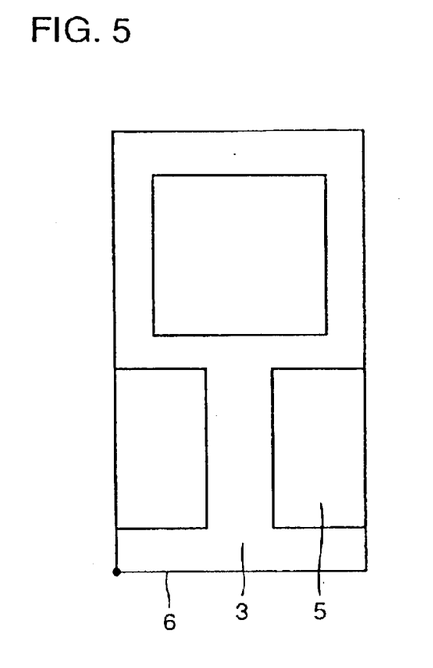
Figure 6:
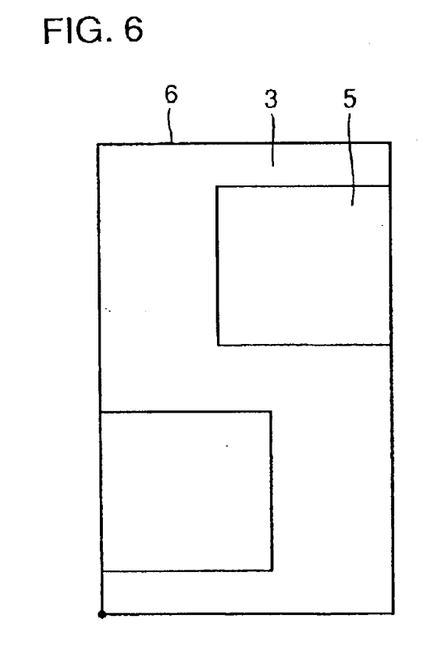

As shown in FIG. 1, a plurality of cell regions 6 divided by an orthogonal grid are placed in a region 60. A dummy pattern 5 is placed in each cell region 6. FIG. 2 is an enlarged view of the region 7 of FIG. 1.

As shown in FIG. 2, individual dummy pattern 5 within cell region 6 is in a rectangular shape that can be formed with two vertexes on CAD data. Thus, the data amount on CAD can be minimized, and an area of region 60 being occupied by the dummy patterns can readily be controlled. Note that a plurality of rectangles may be arranged in each cell region 6, as shown in FIGS. 3 to 6.

Referring next to FIGS. 7 to 11, a CAD flow for placement of an element forming region pattern 4, a well 8, a gate electrode 12 and the like in region 60 having a plurality of cell regions 6 with dummy patterns 5 placed therein will be described. Herein, a step of forming an aluminum interconnection layer or the like is not described.

First, as a step 1 of the flow, cell regions 6 including dummy patterns 5 therein are placed on a grid with a pitch A, over an entire region (CAD chip) 60 constituting a semiconductor device.

Figure 7:
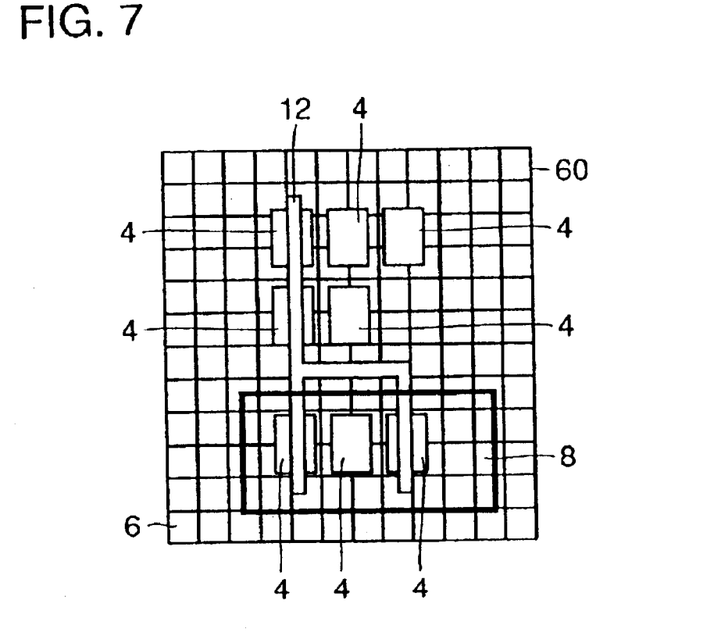
FIGS. 7–11 schematically show steps 1–5 of a CAD flow according to the first embodiment.

Thereafter, as shown in FIG. 7, well 8 (p well or n well), element forming region pattern 4 and gate electrode 12 are placed in region 60.

Figure 8:
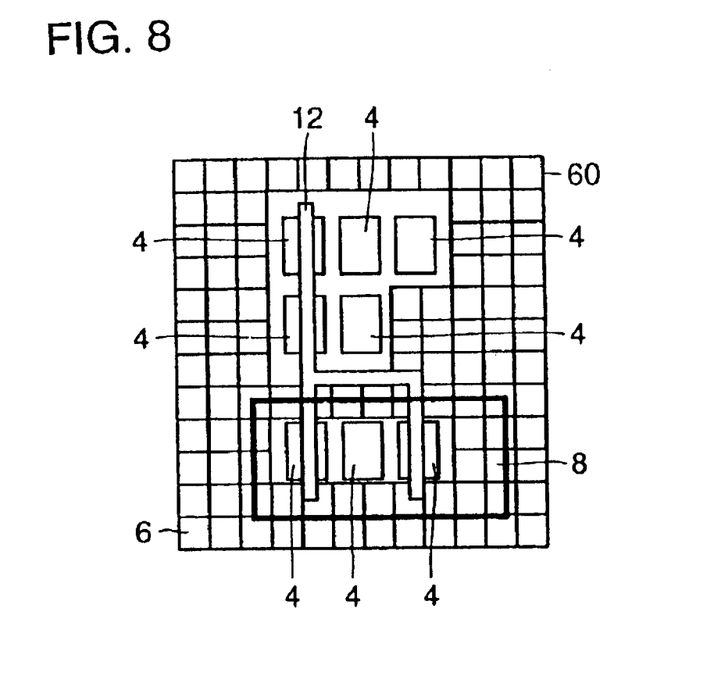

Next, in step 2 of the flow, as shown in FIG. 8, cell region 6 overlapping element forming region pattern 4 is eliminated. At this time, element forming region pattern 4 is made oversized as desired. Specifically, cell region 6 is removed assuming element forming region pattern 4 a little larger than its original size with a prescribed margin added thereto, to ensure sufficient separation or isolation between element forming region pattern 4 and dummy pattern 5.

Figure 9:
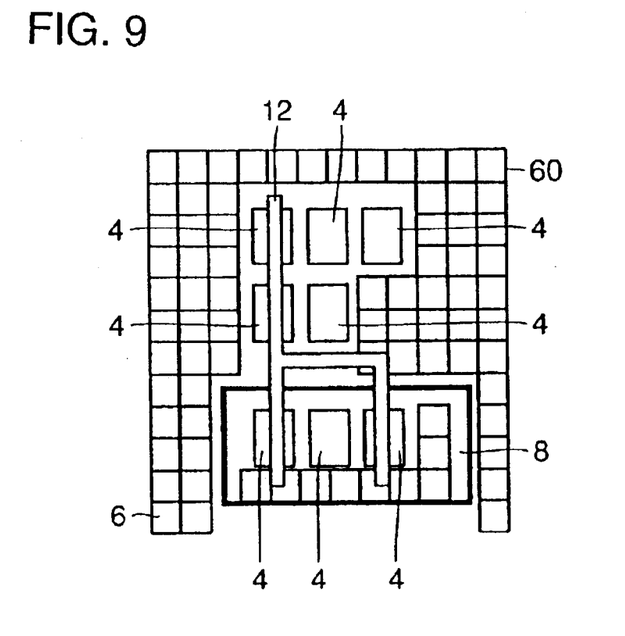

Next, in step 3 of the flow, as shown in FIG. 9, cell region 6 crossing a boundary of well 8 is eliminated. Removed at this time is cell region 6 that overlaps a figure obtained by subtracting an appropriately undersized version of well 8 from a desirably oversized version of well 8. More specifically, cell region 6 overlapping a frame-shaped region enclosed by an outer boundary drawn outside the actual boundary of well 8 with a small margin and an inner boundary drawn inside the actual boundary of well 8 with a small margin is removed. This guarantees adequate isolation at the boundary of well 8.

Figure 10:
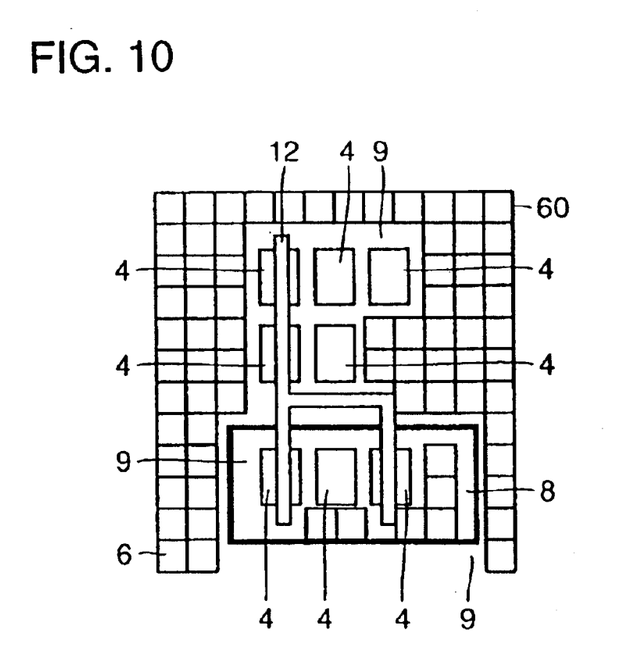

Further in step 4 of the flow, as shown in FIG. 10, cell region 6 overlapping a region for formation of gate electrode 12 is removed. At this time, the region for formation of gate electrode 12 is again made oversized as desired before removal of cell region 6. This secures a margin against misalignment or the like.

Provision of this step 4 in the flow is advantageous since the effects of dummy patterns can be guaranteed without an increase of interconnection capacity of gate electrode 12 or an area increase for reliability of the gate insulating film.

Next, cell regions 6a having dummy patterns 5 therein and having a pitch B smaller than pitch A of cell regions 6 are placed on a grid These cell regions 6a should not be placed in a region (first region) in which cell regions 6 described above are left, and thus, cell region 6a overlapping the cell region 6 is removed. Consequently, cell regions 6a having smaller pitch B are left only in a desired region (second region).

Figure 11:
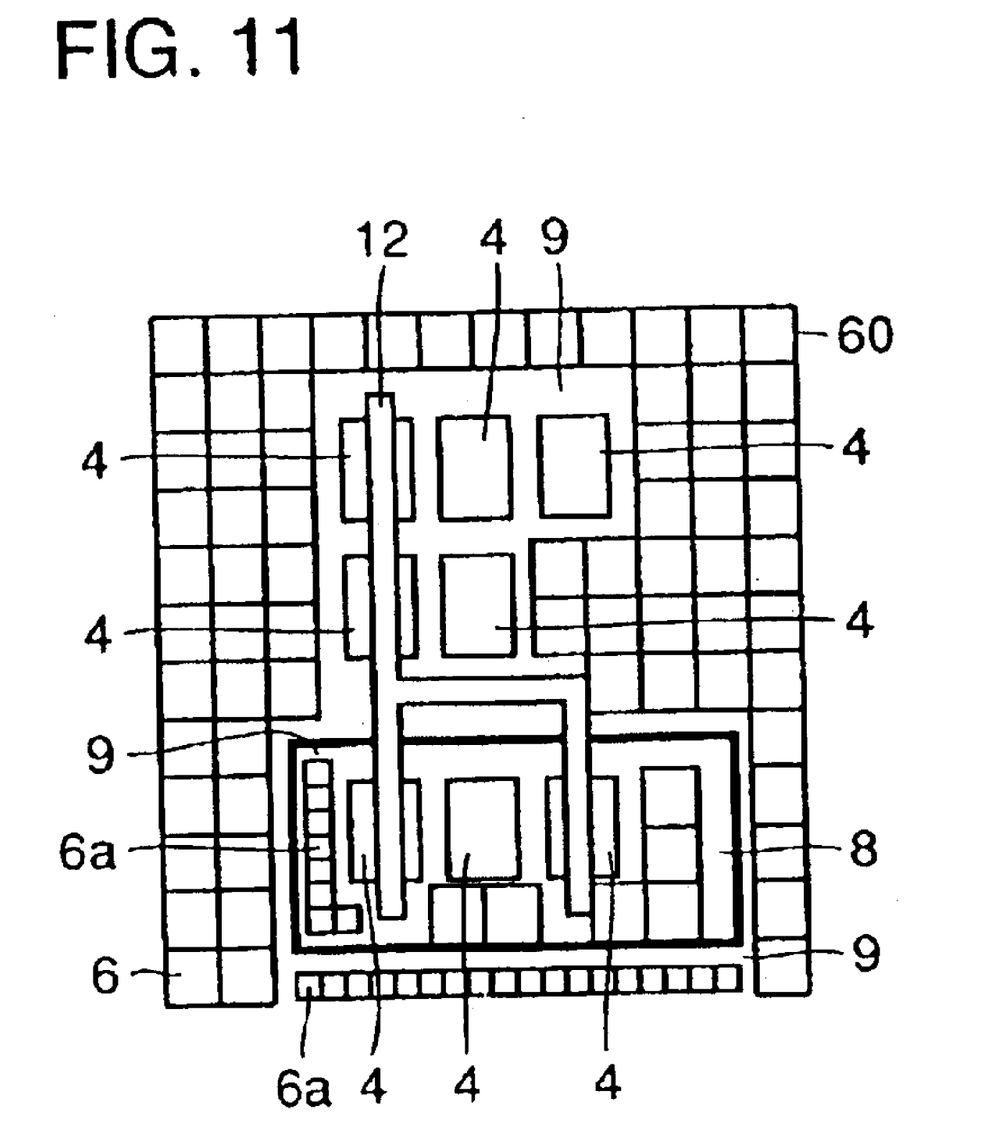

Thereafter, the above-described steps 2–4 of the CAD flow are carried out for cell region 6a, so that cell region 6a having the smaller pitch is placed in region 9 where cell region 6 has not been formed, as shown in FIG. 11. It means that dummy pattern 5 having a small pitch is placed within region 9 (step 5 of the flow). Through the steps as describe above, it is possible to place a plurality of cell regions (dummy patterns) having different pitches successively in different steps.

Cell regions 6, 6a left after completion of steps 1–5 of the flow are merged with element forming region pattern 4. More specifically, an OR operation is conducted, so that cell regions 6, 6a and element forming region pattern 4 are integrated into a plane. Opening patterns for them are then created in one and the same mask (reticle) (step 6 of the flow).

Using this mask, element forming region pattern 4 and dummy pattern 5 in the same layer as pattern 4 are formed in the semiconductor substrate. In the similar manner, gate electrode 12 and dummy pattern 5 in the same layer as gate electrode 12 are formed.

It should be understood that steps 2 to 4 may be done in random order, and steps 3 and 4 can be omitted. Removal of respective dummy patterns 5 can be done in one step by merging them after the regions for forming element forming region pattern 4, well 8 and gate electrode 12 are processed into their desired sizes. The concept of the flow above is applicable to placement of dummy patterns of three or more different pitches.

According to the design flow as described above, it is possible to form dummy patterns 5 having various pitches in appropriate locations respectively. Therefore, it is possible to form dummy pattern 5 of an optimum pitch in each element isolating region according to its size. As a result, it is possible to form dummy patterns thoroughly over the entire semiconductor device, and to further improve planarization of the semiconductor device.

By placing cell regions 6 according to size, in descending order, cell regions 6a having a smaller pitch can be placed only in region 9 where cell regions 6 having a larger pitch have not been placed. In other words, dummy patterns of a smaller pitch are placed only in region 9 including no dummy patterns of a larger pitch. Accordingly, the CAD processing region for placement of dummy patterns of a smaller pitch is reduced, so that, compared to the case where dummy patterns of a fixed, small pitch are being placed over the whole regions, the time for CAD processing and also the memory area being occupied can be reduced.

As a consequence, it is possible to automatically place various kinds of dummy patterns 5 with different pitches. Formation of the mask for manufacture of the semiconductor device is also simplified.

Second Embodiment

An example of the semiconductor device according to the present invention will now be described with reference to FIGS. 12 and 13.

Figure 12:
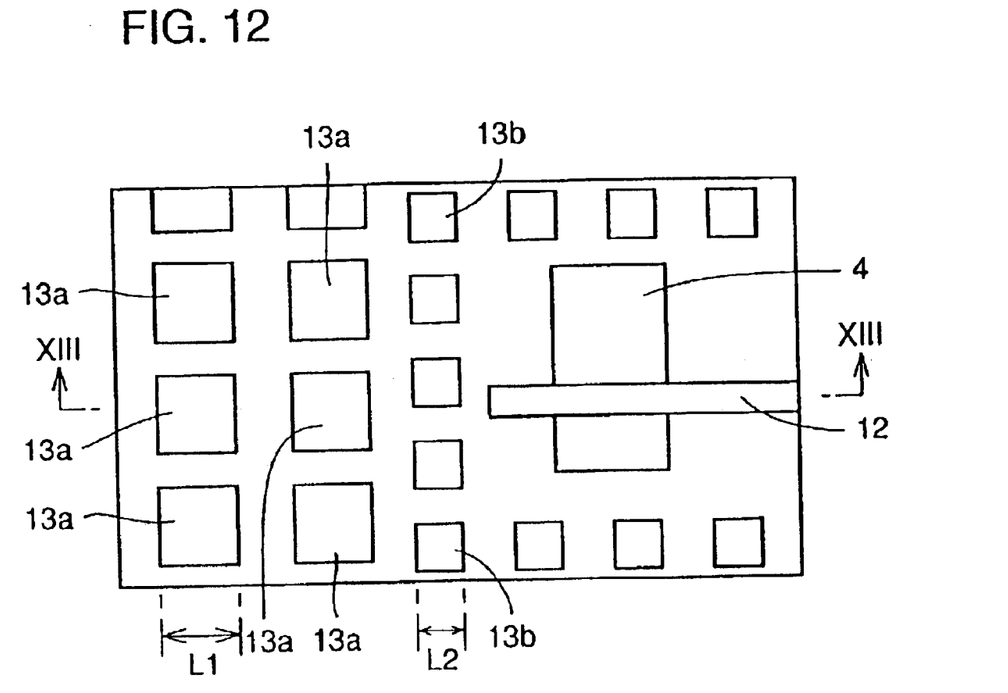
FIG. 12 is a top plan view of a semiconductor device having dummy patterns according to a second embodiment of the present invention.
Figure 13:
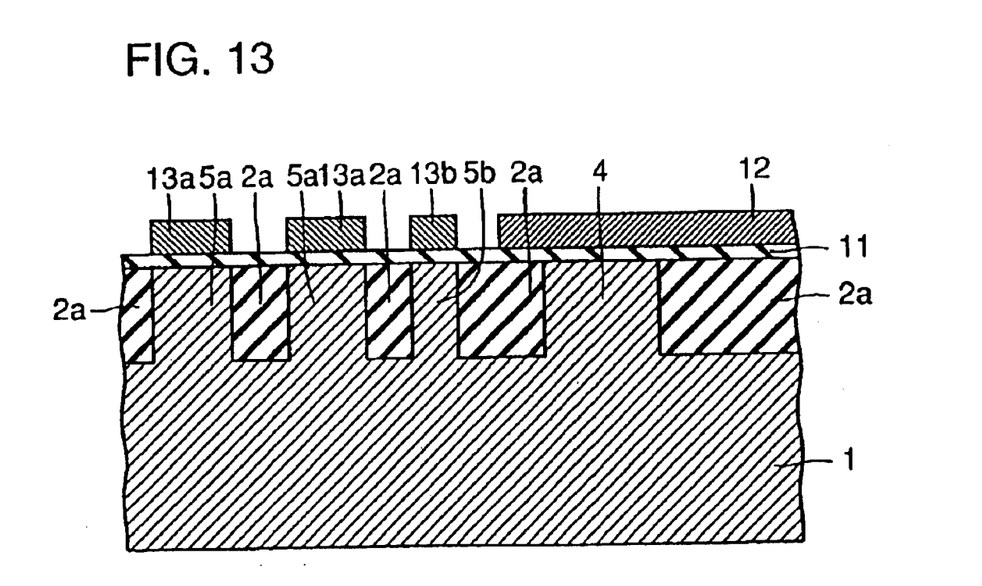
FIG. 13 is a cross sectional view of the semiconductor device taken along with a line XIII—XIII in FIG. 12.

Referring to FIGS. 12 and 13, the semiconductor device according to the present embodiment includes: element forming region pattern 4; first and second active area (A/A) dummy patterns 5a, 5b having pitches different from each other; a trench formed in the element isolating region; separative insulating film 2a embedded in the trench; gate insulating film 11; gate electrode 12; and first and second gate dummy patterns 13a, 13b different in pitches.

First and second A/A dummy patterns 5a, 5b are provided in the same layer as element forming region pattern 4. In the configuration shown in FIGS. 12 and 13, the pitch L1 of first A/A dummy pattern 5a is larger than pitch L2 of second A/A dummy pattern 5b.

To form first and second A/A dummy patterns 5a, 5b, openings for the first and second A/A dummy patterns 5a, 5b are provided in a mask for formation of element forming region pattern 4, according to the flow described above. Using this mask, element forming region pattern 4 and first and second A/A dummy patterns 5a, 5b are formed at the same time.

First and second gate dummy patterns 13a, 13b are provided in the same layer as gate electrode 12. As shown in FIGS. 12 and 13, pitch L1 of first gate dummy pattern 13a is larger than pitch L2 of second gate dummy pattern 13b.

To form first and second gate dummy patterns 13a, 13b, openings corresponding to those patterns are provided, by the above-described flow, in a mask for use in forming gate electrode 12.

Using this mask, gate electrode 12 and, at the same time, first and second gate dummy patterns 13a, 13b are formed on gate insulating film 11. First and second gate dummy patterns 13a, 13b are formed right above first and second A/A dummy patterns 5a, 5b.

Thus, by forming first and second gate dummy patterns 13a, 13b and gate electrode 12 at the same time, a conductive layer for formation of gate electrode 12 is etched, not only at a portion becoming the gate electrode, but also over the entire surface of the semiconductor substrate, in a substantially uniform manner. Accordingly, etch gas or the like is distributed substantially uniformly over the entire surface of the semiconductor substrate, and thus, dimension control by etch of gate electrode 12 improves.

In addition, first and second A/A dummy patterns 5a, 5b in the lower layer and first and second gate dummy patterns 13a, 13b in the upper layer are formed in the same pattern. Thus, pattern data of first and second A/A dummy patterns 5a, 5b can be utilized to obtain data for first and second gate dummy patterns 13a, 13b.

In other words, the pattern data of first and second A/A dummy patterns 5a, 5b and the pattern data of gate electrode 12 can be merged to form those patterns in the same mask. Thus, load of CAD processing is prevented from increasing, which helps improve dimension control in the gate electrode forming process.

Third Embodiment

Hereinafter, the third embodiment of the present invention will be described with reference to FIGS. 14 to 16.

Figure 14:
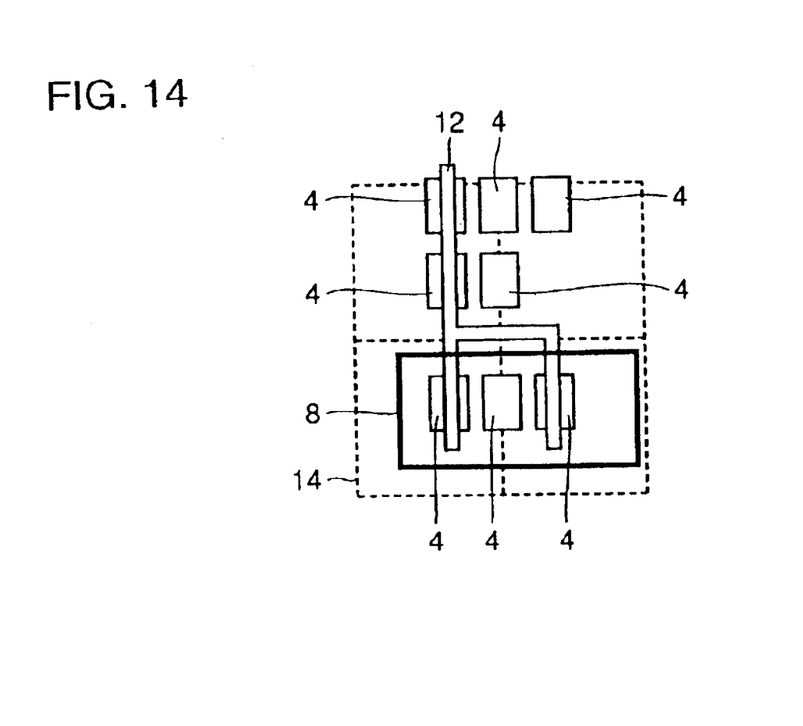
FIG. 14 schematically shows step 1 of a CAD flow according to a third embodiment of the present invention.

In the third embodiment, as shown in FIG. 14, the entire CAD chip (semiconductor chip region) is divided into a plurality of mesh regions 14 having length or width on the order of, e.g., 10–1000 μm. A ratio of an area of mesh region 14 being occupied by the element forming region pattern (A/A pattern) 4 (hereinafter, referred to as "occupy ratio" of the pattern) is then obtained for each mesh region. This occupy ratio of the element forming region pattern is calculated as (the area of element forming region pattern within a mesh region)/(the total area of the mesh region).

This occupy ratio will now be described in more detail with reference to FIGS. 15 and 16. Specifically, the occupy ratio of A/A dummy pattern in the active area (A/A) will be described. FIGS. 15 and 16 are schematic cross sectional views of the semiconductor devices in each of which a buried insulating film 16 is formed after formation of a trench 15.

Figure 15:
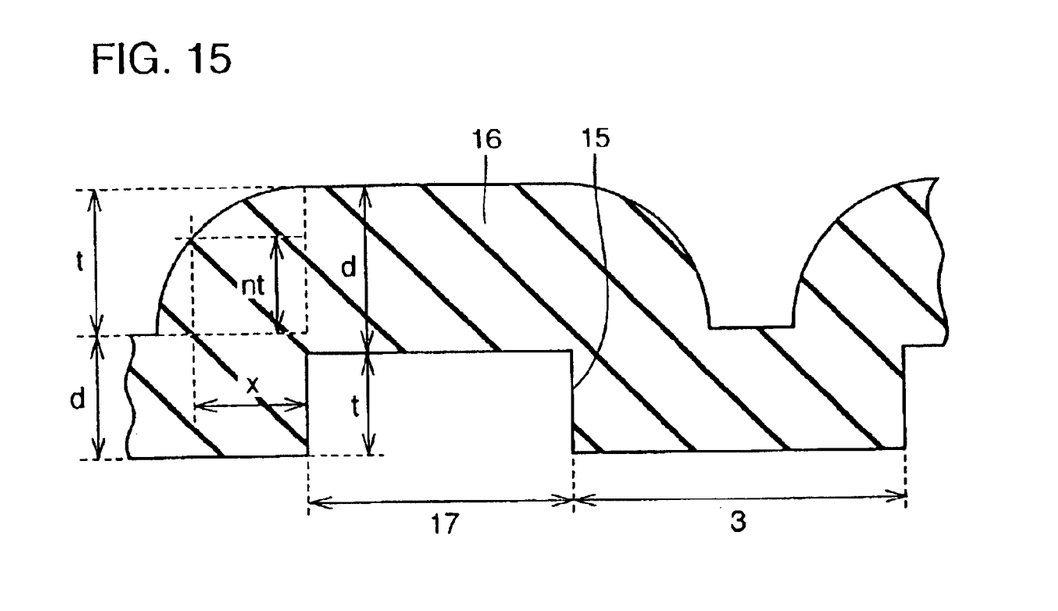
FIGS. 15 and 16 illustrate occupy ratios of convex portions according to the present invention.

FIG. 15 shows the case where the buried insulating film 16 is deposited in a conformal manner with respect to the irregularities, which is, e.g., a TEOS oxide film deposited by a plasma CVD device. FIG. 16 shows the case where etching and deposition are repeated so that the film 16 extends diagonally, at 45 degrees, on the convex portion, which is, e.g., an oxide film deposited by HDP-CVD.

Figure 16:
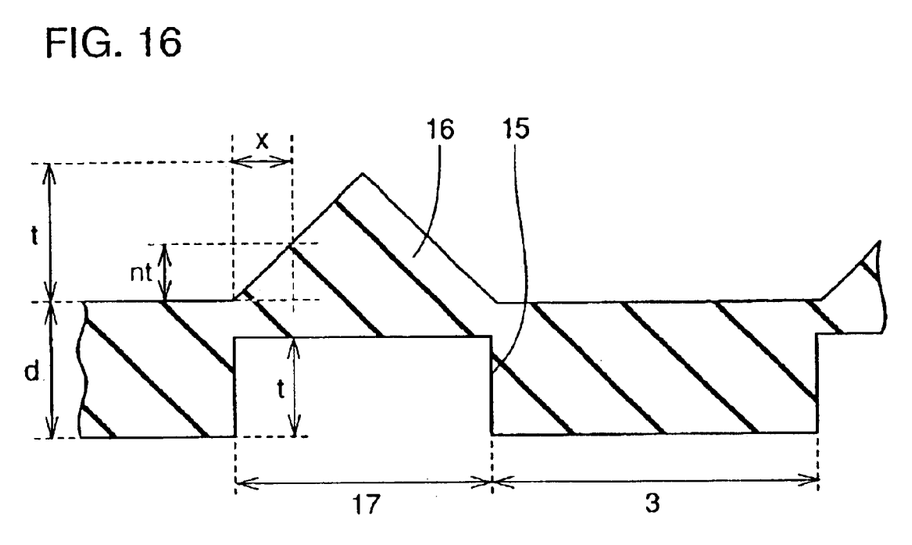

Referring to FIGS. 15 and 16, "t" represents a depth of a trench 15, "d" represents a film thickness of a deposited, buried insulating film 16, "x" represents a sizing amount of A/A convex portion with respect to A/A, and "n" represents a coefficient for determination of a height of A/A convex portion.

When CMP is employed for polishing and planarization, if the occupy ratio of convex portion varies in a wide range, the polishing rate comes to vary because of a difference in pressure applied by the CMP polishing cloth, which leaves absolute steps. More specifically, if the occupy ratios of the convex portions vary more than 20%, significant steps will be observed.

Thus, the occupy ratio of convex portion is defined as follows. First, in the case where buried insulating film 16 is deposited in a conformal manner as shown in FIG. 15, "x" is defined as: $x = t \times \cos(\sin^{-1}(n))$. In the case where buried insulating film 16 extends diagonally, at 45 degrees, as shown in FIG. 16, "x" is defined as: $x = t \times n$.

The value of "n" approximates to 0.5, although it varies depending on a polishing rate. At this time, "the area of A/A convex portion sized by x with respect to each A/A" divided by "the area of entire cell" is considered as the occupy ratio of the convex portion (or, "A/A pattern occupy ratio").

After this A/A pattern occupy ratio is obtained for each mesh region 14 as described above (step 1 of the flow), steps 2–5 the same as the steps 1–4 of the flow in the first embodiment are performed. Cell region 6 and element forming region pattern 4 left after completion of the steps 2–5 are merged and patterned in one and the same mask (step 6 of the flow).

Next, cell region 6 within each mesh region 14 is oversized or undersized, according to the following Table 1, so as to realize a desired level of occupy ratio of A/A dummy pattern within each mesh region 14 (step 7 of the flow).

TABLE 1

| Occupy ratio of element forming region pattern in mesh region (%) | Occupy ratio of dummy pattern in mesh region (%) | Size of dummy cell ($\mu$m□) | Sizing amount ($\mu$m) |
|---|---|---|---|
| 0–20 | 64 | 8 | 0 |
| 20–50 | 36 | 6 | −1 |
| 50–100 | 0 | 0 | −4 |

As seen from Table 1, in a mesh region 14 where the occupy ratio of element forming region pattern 4 is low, cell region 6 having a high dummy pattern occupy ratio is placed. In a mesh region 14 where the occupy ratio of element forming region pattern 4 is high, cell region 6 having a low dummy pattern occupy ratio is placed.

The processes above are carried out for cell region 6a having a smaller area and a narrower pitch B than cell region 6 (pitch A>pitch B), and the patterns are formed into the same mask. At this time, the occupy ratio of dummy pattern in cell region 6a is made greater than that in cell region 6.

As described above, by placing the A/A dummy pattern with a desired occupy ratio according to the occupy ratio of element forming region pattern (element pattern) 4 in each mesh region, it becomes possible to place the A/A dummy pattern thoroughly over the entire semiconductor device. This further improves the planarization thereof.

Note that the steps 3–5 may be done in random order, and steps 4 and 5 can be omitted. Removal of respective A/A dummy patterns can be done in one step by merging them after element forming region pattern 4, the boundary of well region 8, and gate electrode 12 are processed into their desired sizes. In addition, steps 1 and 7 may be done after step 2, as long as step 1 is performed prior to step 7.

Fourth Embodiment

The fourth embodiment of the present invention will now be described. In the third embodiment, placement of dummy patterns in the A/A was discussed. The same concept is applicable to placement of dummy patterns around an interconnection pattern such as metal interconnection.

First, as in the third embodiment, the CAD chip is divided into a plurality of mesh regions 14. A ratio of an area of mesh region being occupied by metal interconnection pattern is then calculated for each mesh region 14. This occupy ratio of metal interconnection pattern is obtained as (the area of metal interconnection pattern within a mesh region 14)/(the total area of the mesh region 14) (step 1 of the flow).

Next, cell regions 6 having metal interconnection dummy patterns therein are placed in an array form on an orthogonal grid with a pitch A, over the entire CAD chip (step 2 of the flow). Cell region 6 overlapping the metal interconnection pattern is then eliminated (step 3 of the flow). At this time, the metal interconnection pattern is made oversized as desired, to ensure sufficient isolation between the metal interconnection pattern and the metal interconnection dummy pattern.

Cell region 6 and metal interconnection pattern left after completion of the steps above are merged and patterned into one and the same mask (step 4 of the flow).

Next, as in the third embodiment, cell region 6 having metal interconnection dummy pattern of a desired occupy ratio is placed in each mesh region 14, according to the following Table 2 (step 5 of the flow).

TABLE 2

| Occupy ratio of metal interconnection pattern in mesh region (%) | Occupy ratio of dummy pattern in mesh region (%) | Size of dummy cell ($\mu$m□) | Sizing amount ($\mu$m) |
|---|---|---|---|
| 0–20 | 64 | 8 | 0 |
| 20–50 | 36 | 6 | −1 |
| 50–100 | 0 | 0 | −4 |

Steps 1–5 above are performed for cell region 6a having a smaller pitch B than that of cell region 6 (pitch A>pitch B), and the patterns are formed into the same mask (step 6 of the flow). At this time, the occupy ratio of metal interconnection dummy pattern within cell region 6a is made greater than that within cell region 6.

As described above, by placing the metal interconnection dummy pattern with a desired occupy ratio according to the occupy ratio of the metal interconnection pattern (element pattern) in each mesh region, it is possible to place the metal interconnection dummy pattern over the entire semiconductor device. Thus, the planarization of the semiconductor device is further improved. Note that the concept of the present embodiment is applicable to any interconnection pattern other than the metal interconnection pattern.

Fifth Embodiment

The fifth embodiment of the present invention will now be described. In the fifth embodiment, after the occupy ratio of element pattern, e.g., A/A pattern or metal interconnection pattern, is obtained for each mesh region 14 as in the third or fourth embodiment, Fourier transform is carried out to determine a distribution of the element pattern occupy ratios over the entire chip.

The sizing process as in step 7 of the third embodiment or in step 5 of the fourth embodiment is then performed according to this distribution of element pattern occupy ratios. This enables more effective selection and placement of the dummy patterns.

Sixth Embodiment

The sixth embodiment of the present invention will now be described. In the sixth embodiment, after an occupy ratio of element pattern, e.g., A/A pattern or metal interconnection pattern, is calculated for each mesh region 14 as in the third or fourth embodiment, an average of the element pattern occupy ratio in a certain mesh region 14 and those in its neighboring n mesh regions 14 (n is an integer, e.g., from 2 to 10) is obtained In this embodiment, the average occupy ratio thus obtained is considered as the element pattern occupy ratio in the relevant mesh region 14.

The sizing process as in step 7 of the third embodiment or in step 5 of the fourth embodiment is then conducted according to the average occupy ratio. Thus, it becomes possible to select and place the dummy patterns more effectively.

Seventh Embodiment

The seventh embodiment of the present invention will now be described. In a multi-layer wiring process, interconnections are stacked one on another, and steps in different layers are accumulated. If regions having dense interconnection patterns therein are stacked one on the other, or if regions having sparse interconnection patterns therein are stacked together, the resulting irregularities will be enormous.

Thus, in the seventh embodiment, after the occupy ratio of element pattern in each mesh region 14 is obtained as in the fourth through sixth embodiments, an occupy ratio of underlayer interconnection in a region immediately beneath each mesh region 14 is also obtained. This occupy ratio of underlayer interconnection is combined with the occupy ratio of element pattern in the corresponding mesh region 14. In this embodiment, the resultant value is considered as the element pattern occupy ratio of the relevant mesh region 14.

The combining step above is performed by multiplying the initially obtained occupy ratio of element pattern in each mesh region 14 by a coefficient "a" as follows:

a=irregularity left in the underlayer interconnection (steps left after planarization in the preceding process step)/ irregularity of the relevant interconnection layer (normal thickness of the interconnection layer).

The sizing process as in step 7 of the third embodiment or step 5 of the fourth embodiment is then conducted according to the element pattern occupy ratio of each mesh region 14 multiplied by coefficient "a" above. This enables more effective selection and placement of the dummy patterns.

Eighth Embodiment

The eighth embodiment of the present invention will now be described. In the eighth embodiment, placement of dummy pattern is conducted without calculating the occupy ratio as above.

Steps of the flow in the present embodiment are fundamentally identical to steps 1–6 of the flow in the first embodiment. However, in the present embodiment, conditions for placement of cell region 6a having a small pitch are defined more specifically than in the first embodiment.

Figure 17A:
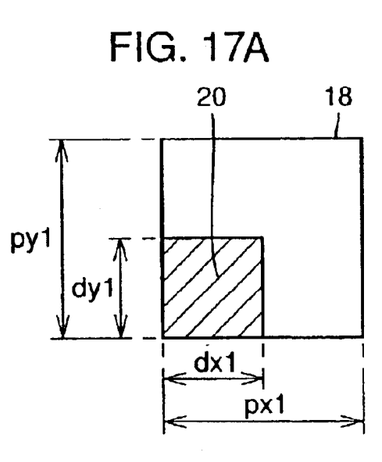
FIGS. 17A and 17B illustrate a characteristic step in an eighth embodiment of the present invention.
Figure 17B:
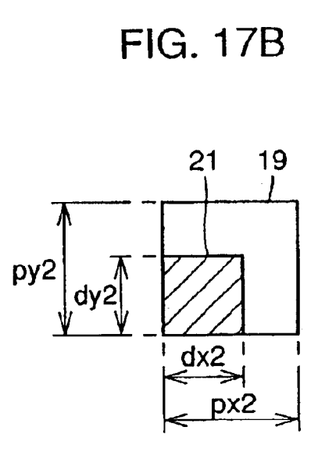

Assume that the size of a first dummy pattern 20 (rectangle or square) being placed at the n-th time is represented as dx1×dy1; the size of a second dummy pattern 21 (rectangle or square) being placed at n-th plus 1 time as dx2×dy2; the pitch of a first cell region 18 being placed at the n-th time as px1×py1; the pitch of a second cell region 19 being placed at the n-th plus 1 time as px2×py2; the oversized amount of A/A for elimination of first cell region 18 as x1; and the oversized amount of A/A for elimination of second cell region 19 as x2. In this case, the first and second dummy patterns 20, 21 are placed under the following conditions:

px1>px2, py1>py2, px1−dx1−2×x2<dx2, py1−dy1−2× x2<dy2, (dx1×dy1)/(px1×py1)<(dx2×dy2)/(px2×py2).

The region where the dummy pattern was not placed at the n-th time is either a region that originally had dense patterns, or a region in which patterns were sparse but placed discretely and the size of the dummy pattern as well as the oversized amount for the elimination were too large, so that the dummy pattern could not be placed therein and accordingly the occupy ratio of dummy pattern is low.

Thus, by placing the dummy patterns on and after the n-th plus 1 time under the conditions described above, dummy patterns can be placed in the region whose dummy pattern occupy ratio is low as in the latter case. Accordingly, it becomes possible to increase the occupy ratio of dummy pattern in the relevant region.

As described above, when the dummy patterns are being placed in several steps, it is possible to place a cell region having a high dummy pattern occupy ratio in a region having a low dummy pattern occupy ratio because dummy pattern was not placed therein in the preceding stage. Accordingly, A/A dummy patterns can be placed thoroughly over the entire semiconductor device, and the planarization thereof is improved. The CAD processing time can also be decreased.

Ninth Embodiment

The concept of the eighth embodiment for placement of dummy pattern 5 in the active area (A/A) can be applied to placement of the dummy pattern around an interconnection pattern like a metal interconnection pattern.

Cell regions 6 having metal interconnection dummy patterns are placed in an array form on an orthogonal grid having a pitch A, over the entire CAD chip (step 1 of the flow). The metal interconnection dummy cell overlapping the metal interconnection pattern is eliminated (step 2 of the flow). At this time, the metal interconnection pattern is made oversized as desired, so that isolation between the metal interconnection pattern and the metal interconnection dummy pattern is secured.

The metal interconnection dummy cell and desired metal interconnection pattern left after completion of the steps above are merged and patterned into one and the same mask (step 3 of the flow).

The steps 1–3 above are repeated for cell region 6a having a narrower pitch and metal interconnection dummy pattern of a smaller area, and the patterns are formed into the same mask (step 4 of the flow). At this time, the metal interconnection dummy patterns are placed under the same conditions as in the eighth embodiment.

Thus, as in the eighth embodiment, it is possible to place the metal interconnection dummy patterns thoroughly over the entire semiconductor device, and hence, the planarization of the semiconductor device is improved. The CAD processing time can also be reduced.

As explained above, according to the present invention, dummy patterns can be placed thoroughly over the entire semiconductor device. Thus, it is possible to improve the planarization of the semiconductor device. In addition, the CAD processing time as well as the CAD processing capacity required for placement of dummy patterns can be reduced. Consequently, it is possible to automatically place various kinds of dummy patterns with different pitches. Each embodiment of the present invention as described above may be utilized alone, or any of them may be combined together where appropriate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of placing a dummy pattern in a semiconductor device that is provided with a first dummy pattern having a relatively large pitch and a second dummy pattern having a relatively small pitch placed in a same layer, wherein
   placement of said first dummy pattern and placement of said second dummy pattern are performed in different steps.

2. The dummy pattern placing method according to claim 1, wherein
   said first and second dummy patterns are placed in an element isolating region of said semiconductor device,
   said element isolating region includes a first region in which said first dummy pattern is being placed and a second region in which said second dummy pattern is being placed, and
   said second dummy pattern is placed in said second region after said first dummy pattern is placed in said first region.

3. The dummy pattern placing method according to claim 1, wherein
   said first and second dummy patterns are placed in a region around an interconnection pattern of said semiconductor device,
   the region around said interconnection pattern includes a first region in which said first dummy pattern is being placed and a second region in which said second dummy pattern is being placed, and
   said second dummy pattern is placed in said second region after said first dummy pattern is placed in said first region.

4. The dummy pattern placing method according to claim 1, wherein
   said first dummy pattern includes a first upper dummy pattern and a first lower dummy pattern,
   said second dummy pattern includes a second upper dummy pattern and a second lower dummy pattern, and
   data for placement of said first and second lower dummy patterns are utilized as data for placement of said first and second upper dummy patterns.

5. The dummy pattern placing method according to claim 1, wherein
   said first dummy pattern is placed in a first cell region and said second dummy pattern is placed in a second cell region,
   said first cell region has a pitch that is greater than a pitch of said second cell region, and
   a ratio of an area in said second cell region being occupied by said second dummy pattern is made greater than a ratio of an area in said first cell region being occupied by said first dummy pattern.

6. A dummy pattern placing method, comprising the steps of:
   dividing a semiconductor chip region into a plurality of mesh regions;
   determining a second occupy ratio that is defined as a ratio of an area of a dummy pattern placed in said mesh region with respect to a total area of said mesh region, based on a first occupy ratio that is defined as a ratio of an area of an element pattern located in said mesh region with respect to the total area of said mesh region; and
   placing said dummy pattern in said mesh region to satisfy said second occupy ratio.

7. The dummy pattern placing method according to claim 6, wherein
   said step of placing said dummy pattern includes the step of
      adjusting a size of said dummy pattern such that said dummy pattern occupies an area within said mesh region corresponding to said second occupy ratio.

8. The dummy pattern placing method according to claim 6, wherein
   said step of determining the second occupy ratio includes the step of
      after determining said first occupy ratio for each said mesh region, performing Fourier transform to obtain occupy ratio distribution of said first occupy ratios over said semiconductor chip region, and
   said step of placing said dummy pattern includes the step of
      placing said dummy pattern according to said occupy ratio distribution.

9. The dummy pattern placing method according to claim 6, wherein
   said step of determining the second occupy ratio includes the step of
      after determining said first occupy ratio for each said mesh region, calculating an average occupy ratio of said first occupy ratios of a plurality of said mesh regions, and
   said step of placing said dummy pattern includes the step of
      placing said dummy pattern according to said average occupy ratio.

10. The dummy pattern placing method according to claim 6, wherein said second occupy ratio is made lower as said first occupy ratio is higher.

11. The dummy pattern placing method according to claim 6, wherein
   said step of determining the second occupy ratio includes the step of
      combining said first occupy ratio with an occupy ratio of element pattern in an underlayer of the relevant mesh region to determine said second occupy ratio.

12. The dummy pattern placing method according to claim 6, wherein
   said first dummy pattern is placed in a first cell region and said second dummy pattern is placed in a second cell region,
   said first cell region has a pitch that is greater than a pitch of said second cell region, and
   a ratio of an area in said second cell region being occupied by said second dummy pattern is made greater than a ratio of an area in said first cell region being occupied by said first dummy pattern.

* * * * *

UNITED STATES PATENT AND TRADEMARK OFFICE
CERTIFICATE OF CORRECTION

PATENT NO.     : 6,753,246 B2
DATED          : June 22, 2004
INVENTOR(S)    : Hiroshi Kawashima et al.

It is certified that error appears in the above-identified patent and that said Letters Patent is hereby corrected as shown below:

<u>Title page, Item [54] and Column 1, line 1,</u>
Title, change the title from "SEMICONDUCTOR DEVICE WITH A FIRST DUMMY PATTERN" to -- SEMICONDUCTOR DEVICE WITH DUMMY PATTERNS --

Signed and Sealed this

Seventh Day of December, 2004

JON W. DUDAS
*Director of the United States Patent and Trademark Office*